United States Patent
Kinoshita

(10) Patent No.: US 7,013,072 B2
(45) Date of Patent: Mar. 14, 2006

(54) OPTICAL DEVICE AND OPTICAL MODULE

(75) Inventor: Junichi Kinoshita, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/994,451

(22) Filed: Nov. 22, 2004

(65) Prior Publication Data

US 2005/0089292 A1    Apr. 28, 2005

Related U.S. Application Data

(62) Division of application No. 10/744,629, filed on Dec. 23, 2003, now abandoned, which is a division of application No. 09/819,221, filed on Mar. 27, 2001, now abandoned.

(30) Foreign Application Priority Data

Mar. 28, 2000  (JP) ............................... 2000-89661

(51) Int. Cl.
    *G02B 6/10* (2006.01)
(52) U.S. Cl. ..................... 385/131; 385/130; 385/14
(58) Field of Classification Search ............... 385/14, 385/18, 27, 31, 10, 47, 129, 130, 131, 132
    See application file for complete search history.

(56) References Cited

U.S. PATENT DOCUMENTS

| | | | | |
|---|---|---|---|---|
| 4,136,928 A | * | 1/1979 | Logan et al. .................. | 385/14 |
| 4,518,219 A | | 5/1985 | Leonberger et al. ......... | 257/623 |
| 4,602,371 A | | 7/1986 | Kawano et al. ............... | 372/45 |
| 4,630,279 A | | 12/1986 | Kajimura et al. ............. | 372/45 |
| 4,865,407 A | | 9/1989 | Suzuki et al. ............... | 385/129 |
| 5,053,039 A | | 10/1991 | Hofmann et al. | |
| 5,364,401 A | | 11/1994 | Ferrante et al. | |
| 5,406,573 A | | 4/1995 | Ozbay et al. ................. | 372/43 |
| 5,577,137 A | * | 11/1996 | Groger et al. ................ | 385/12 |
| 5,601,563 A | | 2/1997 | Burke et al. | |
| 5,619,369 A | | 4/1997 | Yamamoto et al. ......... | 359/328 |
| 5,751,756 A | | 5/1998 | Takayama et al. ............ | 372/46 |
| 5,764,670 A | | 6/1998 | Ouchi ......................... | 372/45 |
| 5,784,400 A | | 7/1998 | Joannopoulos et al. | |
| 5,805,624 A | | 9/1998 | Yang et al. .................... | 372/45 |
| 5,955,749 A | | 9/1999 | Joannopolous et al. ....... | 257/98 |
| 5,998,298 A | | 12/1999 | Fleming et al. ............... | 257/17 |

(Continued)

OTHER PUBLICATIONS

Noda et al., 'three dimensional photonic crystal based on III-V semiconductor at 12 micrometer wavelengths', IEE, 1999.*

(Continued)

*Primary Examiner*—Kaveh Kianni
(74) *Attorney, Agent, or Firm*—Hogan & Hartson, L.L.P.

(57) ABSTRACT

It is an object of this invention to overcome the problems of prior art by a unique arrangement based on a novel idea, and to provide an optical device having desired characteristics and an optical module and optical system incorporating the optical device. Provided is a photonic crystal including a three-dimensional periodic structure formed by using a first material which changes in properties relatively easily and a second material which does not change in properties relatively easily, wherein the first material is preferentially allowed to change in properties to make a refractive index difference between the first and second materials larger than that before the property change. Also provided is an optical device including a photonic waveguide, gain means, and reflecting means, wherein resonance is generated by reversing the propagating direction of light propagating in the photonic waveguide by the reflecting means while a gain is given to the light by the gain means.

10 Claims, 10 Drawing Sheets

U.S. PATENT DOCUMENTS

| | | |
|---|---|---|
| 6,030,391 A | 2/2000 | Brainard et al. |
| 6,056,754 A | 5/2000 | Haines et al. |
| 6,064,683 A | 5/2000 | Johnson ........................ 372/46 |
| 6,081,632 A | 6/2000 | Yoshimura et al. .......... 385/122 |
| 6,252,895 B1 | 6/2001 | Nitta et al. .................... 372/45 |
| 6,416,575 B1 | 7/2002 | Yamada .......................... 117/1 |
| 6,433,931 B1 | 8/2002 | Fink et al. ................... 359/241 |
| 6,479,844 B1 * | 11/2002 | Taylor ......................... 257/192 |
| 6,521,136 B1 | 2/2003 | Sfez et al. ..................... 216/24 |
| 6,650,672 B1 | 11/2003 | Kito et al. ..................... 372/45 |
| 6,852,203 B1 * | 2/2005 | Kawakami et al. ....... 204/192.3 |
| 2002/0126721 A1 | 9/2002 | Kito et al. ..................... 372/45 |
| 2002/0176087 A1 * | 11/2002 | Numai ........................ 356/461 |

OTHER PUBLICATIONS

Noda et al., 'develeopment of a period of three dimensional photonic crystals operating at optical wavelength region', IEEE, 1998.*

* cited by examiner

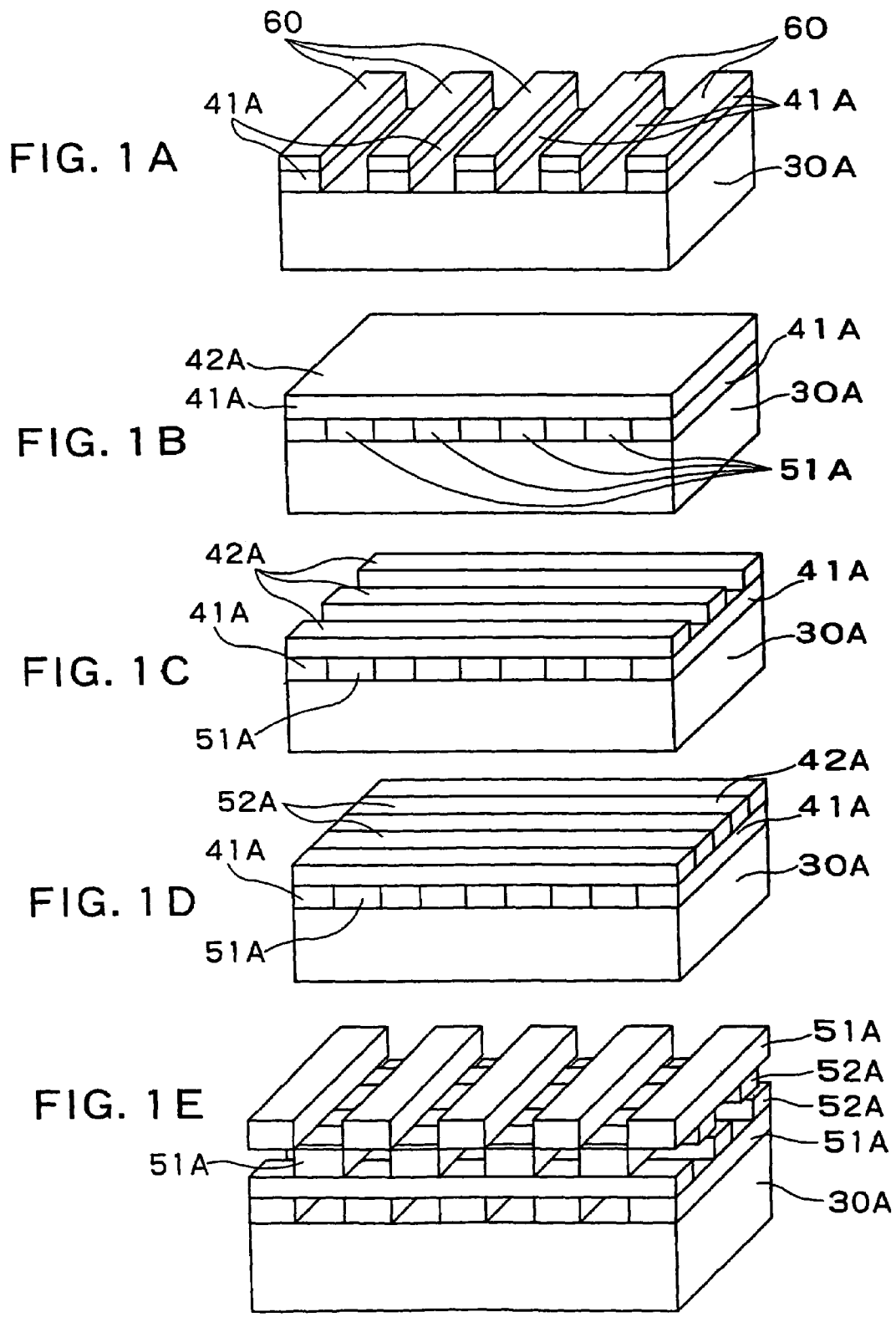

OPTICAL DEVICE AND OPTICAL MODULE

CROSS REFERENCE TO RELATED APPLICATION

This is a divisional of application Ser. No. 10/744,629 filed Dec. 23, 2003 now abandoned, which is a divisional of application Ser. No. 09/819,221 filed Mar. 27, 2001 now abandoned, the entire contents of which are incorporated by reference. This application also claims benefit of priority under 35 U.S.C. §119 to Japanese Patent Application No. 2000-89661, filed on Mar. 28, 2000, the entire contents of which are incorporated by reference.

BACKGROUND OF THE INVENTION

The present invention relates to a photonic crystal, a method of fabricating the same, an optical module, and an optical system. More specifically, the present invention relates to a photonic crystal having a stepped ridge waveguide on the side, surfaces of which steps of about 0.5 μm are symmetrically formed, and capable of being easily and reliably fabricated, to a method of fabricating the same, to an optical module, and to an optical system.

In a structural layer called a "photonic crystal" in which two types of optical media having different refractive indices are periodically arrayed on the wavelength size of light, the relationship between the wave number of light and the frequency, i.e., the photon energy shows a band structure owing to a periodic refractive index change, like the energy of electrons in a semiconductor shows a band structure in a periodic potential.

Photonic crystals having one-dimensional periodic distributions are known as dielectric multilayered films. However, as the periodic distribution becomes two-dimensional and three-dimensional, a photonic crystal exhibits specific optical properties. For example, in a photonic crystal it is possible to produce a wavelength region called a "photonic bandgap" in which light does not propagate in any direction (E. Yablonovitch, Phys. Rev. Lett. 58(20), 2059(1987)). Also, a photonic crystal shows very large optical anisotropy or dispersion. That is, the optical characteristics of a photonic crystal are very distinctive.

When "irregularity" such as a defect with respect to a photonic crystal is introduced to a photonic crystal, the photons are permitted to exist only in that portion. That is, an optical waveguide having high selectivity can be realized. A greater advantage when a photonic crystal is used in an optical waveguide is that a light wave can be sharply bent with no loss in an optical waveguide, a "bend" of the waveguide must be formed with smooth and gradual change since light is scattered and lost by radiation from a steep curve. By contrast, in a photonic crystal light is interrupted by a photonic bandgap except in a waveguide. This can realize a sudden waveguide bent at a right angle. Also, since no smooth curve is necessary, an optical device having a waveguide can be greatly miniaturized.

As described above, a photonic crystal, particularly a three-dimensional photonic crystal has useful features.

A three-dimensional photonic crystal can be formed by arranging periodic structures such as semiconductor/air diffraction gratings in parallel crosses. This structure is called a "wood pile". In a wood pile photonic crystal, it is important to shift, by a half period, the phases of every other, parallel diffraction gratings. A semiconductor/air periodic structure is desirable because the refractive index of one medium of the periodic structure must be twice that of the other (medium) of the periodic structure or larger in order to effectively achieve the properties of a photonic crystal.

Noda reported that a photonic crystal was implemented by the wafer adhesion (fusion) technology (e.g., Journal of Electronic Information Communication Society, 1999, March, pp. 232–241).

FIGS. 12A to 12D are schematic views conceptually showing the formation steps of the photonic crystal reported by Noda. First, as shown in FIG. 12A, a wafer is prepared, in which a diffraction grating 20 having a semiconductor/air stripe structure is formed on the surface of a semiconductor substrate 30. Another wafer in which a diffraction grating 21 is similarly formed on a substrate 31 is also prepared. As shown in FIG. 12B, these two wafers are aligned and fused in parallel crosses on their diffraction grating surfaces.

As shown in FIG. 12C, the substrate 30 is removed by a selective etchant. After that, a wafer similar to that shown in FIG. 12A is rotated 90° and fused such that its diffraction grating surface opposes the other. The substrate of this wafer is removed by a selective etchant. By repeating this step, a structure as shown in FIG. 12D is obtained. In this structure, the phases of every other, parallel stripe diffraction gratings are shifted a half period.

Unfortunately, the above-mentioned method has the following drawbacks.

(1) A hard-to-fuse photonic crystal is difficult to implement.

(2) The substrate removal step is cumbersome, and this substrate removal is also a waste of resources.

(3) The surface of the photonic crystal is uneven, so flat crystal growth is difficult to perform on that surface.

(4) A photonic crystal is not easily formed only on a part of a wafer.

It is one object of the present invention to provide a novel photonic crystal which overcomes the above-mentioned drawbacks, and a method of fabricating the same.

It is another object of the present invention to provide a novel optical device using a photonic crystal. The problems of optical devices relevant to the present invention will be described below by taking a semiconductor laser as an example.

Cleavage surfaces must be formed in conventional semiconductor lasers. This will be explained with reference to a schematic sectional view in FIG. 13. In FIG. 13, unessential layers such as an electrode contact layer are omitted.

A semiconductor laser relevant to the present invention is based on a waveguide structure having again. That is, an active layer 2 is formed on an n-type cladding layer 1 (including a substrate), and a p-type cladding layer 3 is grown on this active layer 2, thereby forming a layered structure in which the active layer 2 is sandwiched. This structure is generally widely known as a "double hetero structure". An electric current is supplied into the shape of a stripe to the p-n junction of this double hetero structure via electrodes 4 and 5, thereby generating a gain. The active layer 2 has a waveguide function because it has a refractive index higher than those of the upper and lower layers 3 and 1.

To form a cavity for performing optical feedback, two end faces 10 and 11 are formed into mirror end faces by cleavage. These cleavage surfaces are laser light output ends. A high-reflectivity coating and an anti-reflectivity coating are formed on these end faces to control the Q value representing the performance of a cavity. That is, the threshold current, slope efficiency, and the like can be controlled by these optical coatings.

As described above, the semiconductor laser relevant to the present invention is not complete as a device unless cleavage end faces are formed. Hence, on-wafer processes and evaluations are difficult to perform, resulting in very low productivity.

A VCSEL (Vertical Cavity Surface Emitting Laser) is an example of semiconductor lasers using no cleavage end faces.

FIG. 14 conceptually shows the structure of the VCSEL. The VCSEL has a structure in which a thin gain medium (active layer) 2 is sandwiched between high-reflectivity multilayered films (DBRS: Distributed Bragg Reflectors) 12 and 13. Like a waveguide laser, the active layer 2 is sandwiched between cladding layers 1 and 3 to form a double hetero structure. In this VCSEL, no cleavage surfaces are necessary, but the small volume of the active layer 2 having a gain increases the current density. Therefore, gain saturation and heat generation make high-output operations difficult. This small volume of the active region is suited to low-threshold operations. However, high-output operations and high-temperature operations are more demanded in actual laser applications.

Noda also proposed a surface emitting laser using a photonic crystal in the abovementioned reference. This laser is shown in FIG. 15. The laser simply utilizes a high-reflection function of a photonic crystal W2. That is, the laser shown in FIG. 15 is fabricated by fusing a wafer W1 having cladding layers 1 and 3 and an active layer 2, and the photonic crystal W2. With this arrangement, a light emission area is large, so high output can be expected. However, the laser requires a lens to focus a beam to one point. A small beam spot is an essential characteristic in applications such as coupling to an optical fiber and read/write to a DVD (Digital Versatile Disk).

At present, forming an active layer in a photonic crystal and injecting an electric current into it encounter difficulties in fabrication. Therefore, a wafer having an active layer and a photonic crystal are separately fabricated and bonded by the fusing technology at a later time. That is, since there is no convenient method of readily integrating a gain region and a photonic crystal, a gain region must be formed outside a photonic crystal.

When the problems described in detail above of the devices relevant to the present invention are taken into consideration, the most expected laser has the following features.

(1) Surface light emission
(2) High output
(3) High-temperature operation (stably operable over a broad temperature range)
(4) Fine spot, narrow beam
(5) Relatively simple fabrication method The present invention has been made in consideration of the above features. That is, it is the second object of the present invention to provide an optical device which overcomes the conventional technical problems by a unique arrangement based on a new idea and has desired characteristic features as described above, and to provide an optical module and optical system incorporating the optical device.

SUMMARY OF THE INVENTION

As described above, it is the first object of the present invention to provide a novel three-dimensional photonic crystal which overcomes the above drawbacks, and a method of fabricating the same.

It is the second object of the present invention to provide a novel optical device using a photonic crystal.

To achieve the above first object, a photonic crystal of the present invention comprises a three-dimensional periodic structure formed by using a first material which changes in properties relatively easily and a second material which does not change in properties relatively easily, wherein the first material is preferentially allowed to change in properties to make a refractive index difference between the first and second materials larger than that before the property change.

With this arrangement, even a hard-to-fuse crystal can be easily formed, no substrate removal step is necessary, and no resources are wasted. Also, crystal growth is possible on an even flat surface of a photonic crystal, and a photonic crystal is readily formable only on a portion of a wafer.

When the property change is oxidation, it is readily possible to realize a photonic crystal having a large refractive index difference by using a readily oxidizable material including element such as aluminum (Al).

A photonic crystal fabrication method of the present invention comprises at least the steps of forming, on a substrate, a first stripe structure layer in which stripes of a first material and stripes of a second material are alternately arrayed periodically in plane along a first direction, stacking, on the first stripe structure layer, a second stripe structure layer in which stripes of the first material and stripes of the second material are alternately arrayed periodically in plane along a second direction substantially perpendicular to the first direction, stacking, on the second stripe structure layer, a third stripe structure layer in which stripes of the first material and stripes of the second material are alternately arrayed periodically in plane along the first direction, such that the array is shifted a half period from the in-plane periodic array of the first stripe structure layer, stacking, on the third stripe structure layer, a fourth stripe structure layer in which stripes of the first material and stripes of the second material are alternately arrayed periodically in plane along the second direction, such that the array is shifted a half period from the in-plane periodic array of the second stripe structure layer, and preferentially removing the stripes of the first material by etching, or preferentially changing properties of the stripes of the first material, thereby making a refractive index difference between the first and second materials larger than that before the removal, or before the property change.

With this arrangement, even a hard-to-fuse crystal can be easily formed, no substrate removal step is necessary, and no resources are wasted. Also, crystal growth is possible on an even flat surface of a photonic crystal, and a photonic crystal is readily formable only on a portion of a wafer.

When the property change is oxidation, it is readily possible to realize a photonic crystal having a large refractive index difference by using a readily oxidizable material including an element such as aluminum (Al).

To achieve the second object of the present invention, an optical device of the present invention comprises a photonic waveguide which is formed in a photonic crystal having a three-dimensional periodic refractive index distribution, and in which the periodic refractive index distribution is locally disturbed, gain means for giving a gain to light propagating in the photonic waveguide, and reflecting means for reflecting light propagating in the photonic waveguide to reverse the propagating direction of the light, wherein resonance is generated by reversing the propagating direction of light propagating in the photonic waveguide by the reflecting means while a gain is given to the light by the gain means.

With this arrangement, surface light emission is possible, and a high output, high-temperature operation is readily achievable. A fine spot and a narrow beam are also easily realizable, and the fabrication method is relatively simple.

The photonic waveguide can comprise a main waveguide portion substantially parallel to a principal surface of the photonic crystal and a branched waveguide portion connected at a substantially right angle to the main waveguide and extending toward the principal surface of the photonic crystal, and the reflecting means can be formed at the end of the branched waveguide portion.

The photonic waveguide can comprise a plurality of branched waveguide portions connected to the main waveguide portion, and the reflecting means formed at the end of at least one of the plurality of branched waveguide portions has reflectivity lower than that of reflecting means formed at the ends of other branched waveguide portions, and functions as a light output portion or as a light input portion.

The branched waveguide portion corresponding to the light, output portion or the light input portion can be connected to the vicinity of a portion where the intensity of light propagating in the main waveguide portion is a maximum.

The plurality of branched waveguide portions can be periodically connected at equal intervals to the main waveguide, portion.

The gain means can comprise a semiconductor having a p-n junction and give the gain by injecting minority carriers into the p-n junction.

The optical device can further comprise phase control means for controlling the phase of light propagating in the photonic 20 waveguide.

The optical device can further comprise light modulating means such as a surface emitting electro absorption type modulator for modulating output light from the photonic waveguide, light receiving means for detecting output light from the photonic waveguide, or wavelength selecting means, at the end of the branched waveguide portion.

An optical module of the present invention comprises any one of the optical devices described above, a driving circuit for supplying an electric current for driving the optical device, and optical means for giving an optical action to output light from the optical device or input light to the optical device.

An optical system of the present invention is implemented as an optical communication system or optical measurement system comprising the optical module described above, a signal supply circuit for supplying an electrical signal to the optical module, and guiding means for guiding output light from the optical module.

BRIEF DESCRIPTION OF THE DRAWINGS

FIGS. 1A to 1E are, perspective views showing the steps of a method of fabricating a photonic crystal as the first embodiment of the present invention;

DESCRIPTION OF THE PREFERRED EMBODIMENT

Figure 2A:
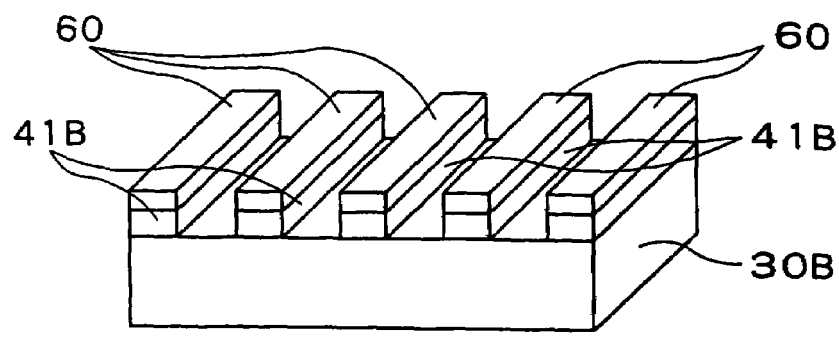
FIGS. 2A to 2E are perspective views showing a method of fabricating a photonic crystal as the second embodiment of the present invention.

One point of the present invention is that diffraction grating layers made of two types of materials differing in etching rate or oxidation rate are stacked in parallel crosses while the flat surface is maintained, and after that etching or oxidation is performed to form a photonic crystal.

The other point of the present invention is that a vertically bent waveguide is formed using a photonic crystal and a gain mechanism and a reflecting mechanism are formed at the ends of this waveguide, thereby realizing a surface emitting optical device having dramatically improved optical output characteristics and temperature characteristics and also having high productivity.

Embodiments of the present invention will be described in detail below with reference to practical examples.

(First Embodiment)

First, a photonic crystal as the first embodiment of the present invention will be described below. In this embodiment, diffraction gratings made of two types of materials having different etching rates are stacked in parallel crosses. After that, one material is selectively etched away to form a photonic crystal having a three-dimensional periodic structure of the other material and the air.

FIGS. 1A to 1E are perspective views showing the steps of a method of fabricating the photonic crystal of this embodiment.

Details of the method will be described below by taking an InP-based material as an example.

First, as shown in FIG. 1A, a diffraction grating 41A consisting of an InGaAs ternary mixed crystal or an InGaAsP quaternary mixed crystal is formed on an n-type InP substrate 30A. As shown, this diffraction grating is formed by periodically arranging stripes in plane, and the period can be properly determined corresponding to the wavelength of light as an object to be optically affected by a photonic crystal. A mask 60 made of SiO₂ or the like is formed on this diffraction grating 41A.

Subsequently, an n-type InP layer 51A is buried in the spaces of the diffraction grating 41A. In this manner, a stripe structure layer in which the stripes of the diffraction gratings 41A and 51A are alternately arrayed periodically in plane can be formed. The SiO₂ mask 60 functions as a mask for avoiding the growth of the InP crystal 51A on the diffraction grating 41A. This mask 60 is then removed, and the same material as the diffraction grating 41A, i.e., the InGaAs ternary mixed crystal or the InGaAsP quaternary mixed crystal is grown on the entire surface. FIG. 1B shows the state in which this growth layer 42A is formed.

Subsequently, as shown in FIG. 1C, the growth layer 42A is fabricated into stripes in a direction perpendicular to the diffraction grating 41A, thereby forming another diffraction grating. Although an SiO₂ mask or the like can be used in this fabrication, this mask is omitted from FIG. 1C.

As shown in FIG. 1D, an n-type InP layer 52A is buried in the spaces of this diffraction grating 42A. In this way, a stripe structure layer in which the stripes of the diffraction grating 42A and 52A are alternately arrayed periodically in plane can be formed.

After that, the steps shown in FIGS. 1B to 1D are repeated such that the phases of every other, parallel stripe diffraction gratings are shifted a half period.

After a predetermined number of diffraction grating layers are thus stacked, a sulfuric acid-based etchant is used to etch away only the diffraction gratings 41A and 42A made of the InGaAs ternary mixed crystal or the InGaAsP quaternary mixed crystal. That is, when the diffraction grating layer 41A or 42A is exposed to the wafer surface, the etchant can gradually penetrate to the interior from that surface and entirely etch away the diffraction grating layers 41A and 42A.

On the other hand, even when another layer (not shown) is formed on the diffraction grating layers, the etchant can gradually penetrate to the interior from the wafer side surfaces by side etching and entirely etch away the diffraction gratings 41A and 42A. That is, even when the etching starts from a partial section, the diffraction gratings 41A and 42A made of the InGaAs ternary mixed crystal or the InGaAsP quaternary mixed crystal can be completely removed without producing any unetched portions, because these diffraction gratings are internally connected.

When the diffraction gratings 41A and 42A are thus etched away, as shown in FIG. 1E, only the InP frameworks 51A and 52A which are kept unetched remain to complete a three-dimensional photonic crystal.

In this embodiment, another constituent element can also be formed on the photonic crystal before the etching step. That is, another constituent element of an optical device can be formed on the crystal in the state as shown in FIG. 1D, and the diffraction gratings 41A and 42A can be etched by side etching after that when the photonic crystal is fabricated in this order, a predetermined semiconductor layer or the like can be epitaxially grown on the flat surface before the diffraction gratings 41A and 42A are removed by etching. This can improve the crystal quality of a material formed on the photonic crystal.

The above practical example is merely one example. That is, a photonic crystal can be similarly formed by forming diffraction gratings by using two types of materials whose etching rates are different to some extent with respect to predetermined etching conditions. Also, the etching method is not restricted to wet etching described above, and it is possible to use various vapor phase etching processes using etching gases or reactive gases. Furthermore, a photonic crystal as shown in FIG. 1E can also be formed by forming diffraction gratings as shown in FIG. 1D by using two types materials having different equilibrium vapor pressures, and then removing one diffraction grating by sublimation by raising the temperature and, if necessary, reducing the pressure.

(Second Embodiment)

A photonic crystal as the second embodiment of the present invention will be described below. In this embodiment, diffraction gratings made of two types of materials having different oxidation rates are stacked in parallel crosses. After that, one material is selectively oxidized to form a photonic crystal having a three-dimensional periodic structure of the oxide and the other material.

FIGS. 2A to 2E are perspective views showing the steps of a method of fabricating the photonic crystal of this embodiment.

Details of the method will be described below by taking a GaAs-based material as an example.

First, as shown in FIG. 2A, a diffraction grating 41B consisting of GaAlAs is formed on a GaAs substrate 30B. Also, a mask 60 made of SiO₂ or the like is formed on this diffraction grating 41B.

Figure 2B:
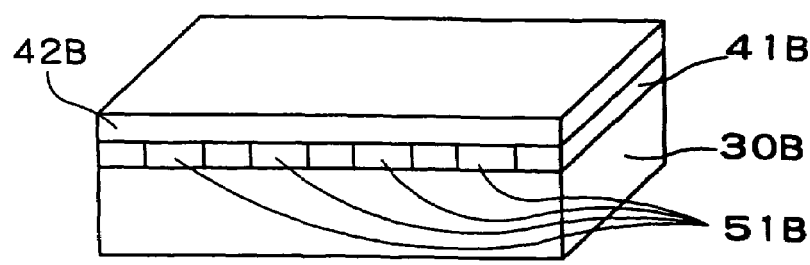

Subsequently, an AlAs layer 51B is buried in the spaces of the diffraction grating 41B. The SiO₂ mask 60 functions as a mask for avoiding the growth of the AlAs on the diffraction grating 41B. This mask 60 is then removed, and a layer of GaAlAs, i.e., the same material as the diffraction grating 41B, is grown on the entire surface. FIG. 2B shows the state in which this growth layer 42B is formed.

Figure 2C:
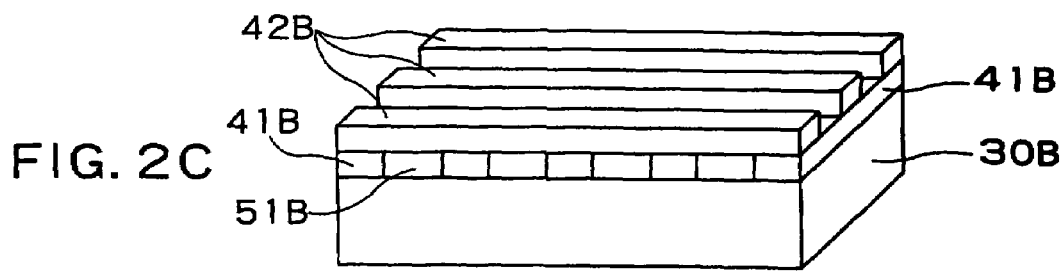

Subsequently, as shown in FIG. 2C, the growth layer 42B is fabricated into stripes in a direction perpendicular to the diffraction grating 41B, thereby forming another diffraction grating. Although an SiO₂ mask or the like can be used in this fabrication, this mask is omitted from FIG. 2C.

Figure 2D:
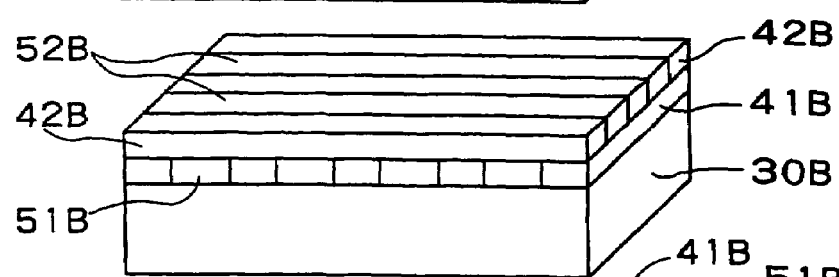

As shown in FIG. 2D, an AlAs layer 52B is buried in the spaces of this diffraction grating 42B.

After that, the steps shown in FIGS. 2B to 2D are repeated such that the phases of every other, parallel stripe diffraction gratings are shifted a half period.

Figure 2E:
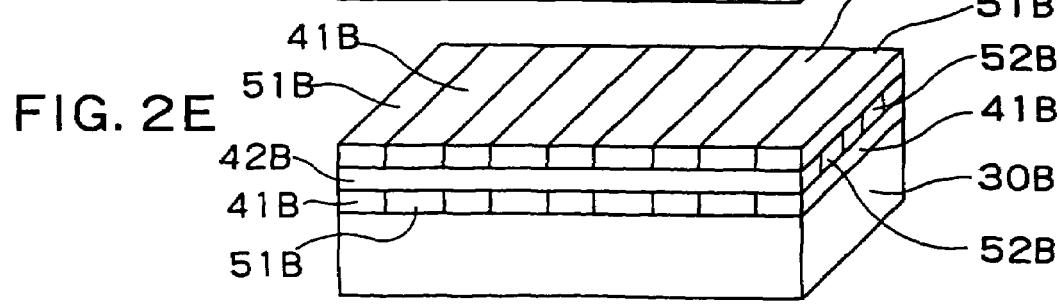

After a predetermined number of diffraction grating layers are thus stacked, the resultant structure is exposed to an oxidizing atmosphere to selectively oxidize only the AlAs layers 51B and 52B. When oxidized, these AlAs layers turn into an oxide of Al and decrease their refractive index to about half that of the GaAlAs layers 41B and 42B. As a consequence, a three-dimensional photonic crystal as shown in FIG. 2E is obtained.

In this selective oxidation, when the diffraction grating layer 41B or 42B is exposed to the wafer surface, oxygen can gradually penetrate to the interior from that surface and entirely oxidize the AlAs layers 41B and 42B.

On the other hand, even when another layer (not shown) is formed on the diffraction grating layers, oxygen can gradually penetrate to the interior from the wafer side surfaces to entirely oxidize the AlAs layers 41B and 42B. That is, even when the oxidation starts from a partial section, the AlAs layers 41B and 42B can be completely oxidized without producing any unoxidized portions, because these layers are internally connected.

In this embodiment as described above, a sufficiently large refractive index difference can be obtained by selectively oxidizing one of the two types of materials forming the diffraction gratings. In addition, the planarity is excellent because there is no hollow portion unlike in the first embodiment.

Accordingly, the photonic crystal of this, embodiment is 20 also advantageous in that another crystal layer can be easily grown flat on this photonic crystal. In forming an optical device incorporating the photonic crystal of this embodiment, another constituent element can also be formed on the photonic crystal before the selective oxidation step. That is, another constituent element of an optical device can be formed on the crystal in the state as shown in FIG. 2D, and the selective oxidation step can be performed after that. When the photonic crystal is fabricated in this order, a predetermined semiconductor layer or the like can be epitaxially grown on the AlAs layers 41B and 42B in the crystal state before oxidation. This can improve the crystal quality of a material formed on the photonic crystal.

(Modifications of First & Second Embodiments)

In the first and, second embodiments described above, diffraction gratings are formed by the method of growing a semiconductor layer on the entire surface and then removing the layer into stripes. However, the present invention is not limited to this method.

For example, when the most advanced technology of the crystal growth method is used, stripes of a predetermined material can be formed on a substrate as if these stripes were written. An example of the method uses a focused molecular beam or an ion beam. Atoms (or molecules or clusters thereof) of a material can also be arranged into stripes by probing on a substrate by a method based on STM (Scanning Tunneling Microscopy).

In the diffraction grating formation steps previously described in connection with FIGS. 1A and 1C or 2A and 2C of the present invention, stripe diffraction gratings can be directly formed by any of the above methods, and the spaces in these diffraction gratings can be filled after that as described above in relation to FIGS. 1B and 1D or 2B and 2D.

When stripes are directly formed by using a molecular beam, ion beam, or STM, a photonic crystal can be selectively formed only on a portion of a substrate. As a result, a waveguide in which photons are allowed to exist can be easily formed on a substrate. Also, an active region such as a light emitting layer having a p-n junction, a current flowing region, and the like can be freely laid out.

In the present invention, when the photonic crystal is to be integrated with another device, etching and selective oxidation can be performed after the other device is formed. Therefore, these active layer and waveguide layer can be freely formed by crystal growth on the photonic crystal. Additionally, a photonic crystal can be freely grown on the active layer or waveguide layer. This is because in this stage a portion to be changed into a photonic crystal is filled with a crystal.

In the practical examples explained above, a layer to be turned into a diffraction grating is formed by crystal growth. However, the present invention is not restricted to these examples. For instance, a diffraction grating can also be formed by using a layer in polycrystalline state or amorphous state. As the material of this diffraction grating, various inorganic materials and organic materials can be used in addition to semiconductors. That is, a wide variety of materials can be used with no limitations as long as they do not depart from the gist of the invention.

Furthermore, the photonic crystal according to the present invention is applicable to diverse optical devices such as a waveguide, LED (Light Emitting Diode), LD (Laser Diode), and PD (PhotoDiode).

(Third Embodiment)

An optical device as the third embodiment of the present invention will be described below. This embodiment relates to a novel surface emitting optical device in which a gain structure is placed at each end of a vertically bent waveguide using a photonic crystal.

Figure 3:
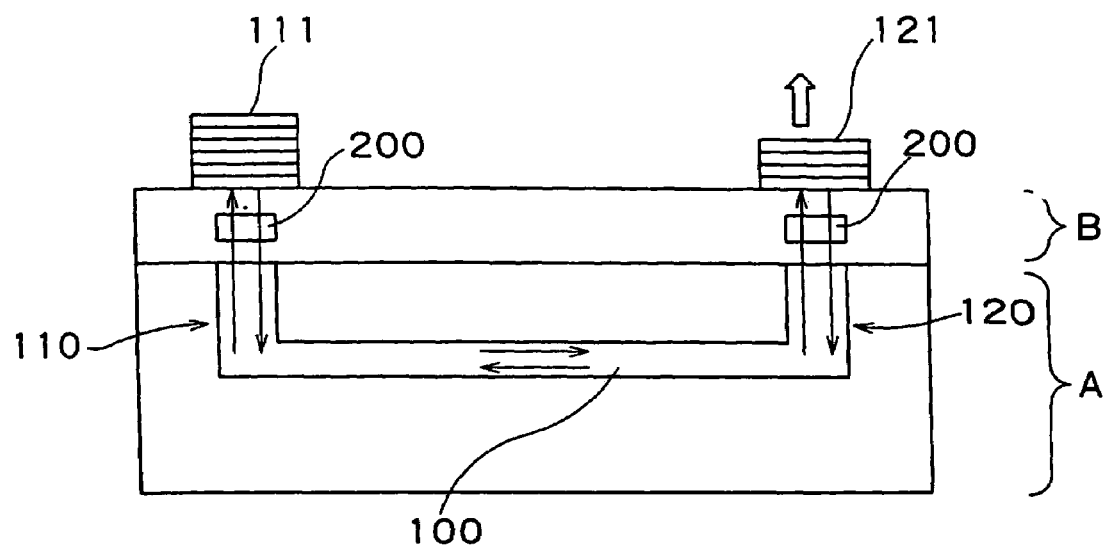
FIG. 3 is a sectional view conceptually showing the arrangement of an optical device as the third embodiment of the present invention.

FIG. 3 is a sectional view conceptually showing the arrangement of the optical device of this embodiment.

The optical device of this embodiment is based on a waveguide cavity structure. That is, a waveguide 100 is formed in a photonic crystal A. This waveguide 100 can be formed in the photonic crystal A by first forming the photonic crystal A, and then destroying its periodic structure by selectively introducing defects to a prospective waveguide portion. The waveguide 100 can also be formed in the photonic crystal A by selectively forming this photonic crystal in a portion except for a prospective waveguide portion, when the photonic crystal is formed by the method described earlier in connection with the first or second embodiment. In either method, light in this wave guide 100 is confined with high efficiency by the photonic band of the surrounding photonic crystal.

Note that the photonic crystal used in the optical device of this embodiment and in optical devices of other embodiments to be enumerated later is not necessarily limited to the photonic crystal previously described in relation to the first or second embodiment, so other types of photonic crystals can also be used. For example, the photonic crystal fabricated by the wafer fusion technology as described earlier in connection with FIGS. 12A to 12D can also be used.

In the optical device shown in FIG. 3, although gain means can be formed in this waveguide 100, they can also be formed as passive waveguides outside the waveguide 100. This photonic waveguide 100 includes a main waveguide portion and branched waveguide portions 110 and 120. The main waveguide portion is substantially parallel to the principal surface of the photonic crystal A. The branched waveguide portions 110 and 120 are connected at substantially a right angle to the two end portions of the main waveguide portion, and extend substantially vertically to the device surface.

At the two ends of the waveguide 100, active layers 200 as gain means are formed. Each active layer 200 can produce a gain by current injection in a p-n junction, or can be of optical pumping type by which pumping light is incident. As a device structure, the photonic crystal A in which the waveguide 100 is formed can be fused to a crystal B in which the active layers 200 are formed. When the method described above in connection with the first or second embodiment is used, a crystal containing the active layers 200 can be grown with high crystal quality on a flat diffraction grating before etching or oxidation.

On the upper surface of the optical device, high-reflectivity films 111 and 121 as reflecting means are formed. These high-reflectivity films 111 and 121 increase the surface reflectivity to feed back light. Each of these high-reflectivity films 111 and 121 can be formed as a dielectric multilayered film as a one-dimensional photonic crystal, or by using a thin metal film. Alternatively, a new three-dimensional photonic crystal, can be fused to the surface, or a DBR (Distributed Bragg Reflector) using a thin multilayered film can be previously formed by crystal growth. That is, any structure which increases the reflectivity can be used.

Furthermore, the reflectivity of one (in FIG. 3, the high-reflectivity film 111) of these high-reflectivity films at the two ends is increased to near 100%, and the reflectivity of the other (in FIG. 3, the high-reflectivity film 121) is set to about 70% to obtain optical output.

Figure 14:
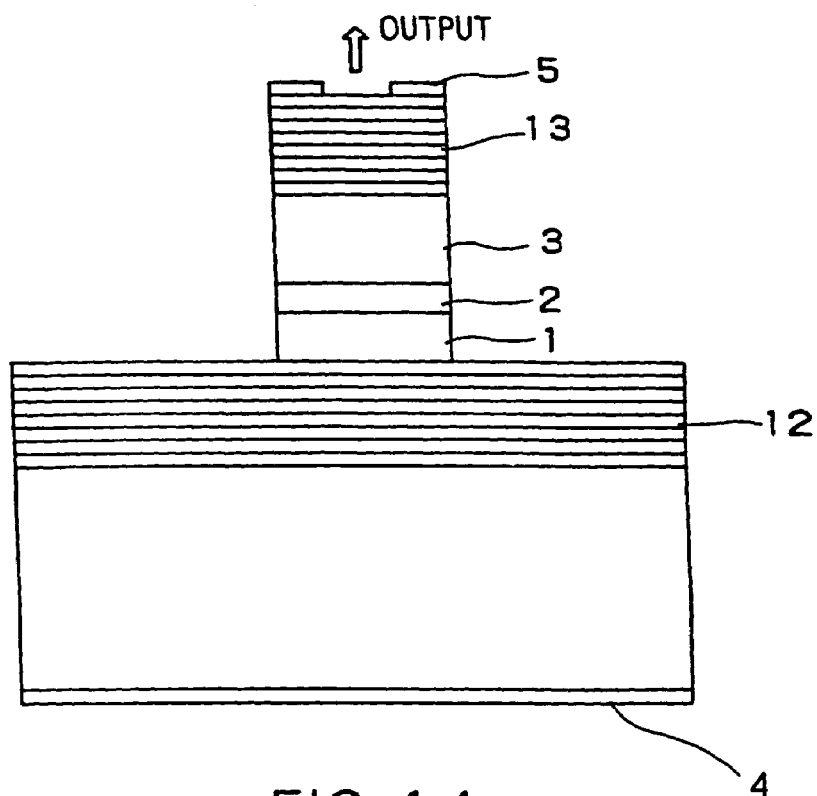
FIG. 14 is a sectional view conceptually showing the arrangement of a VCSEL.
Figure 15:
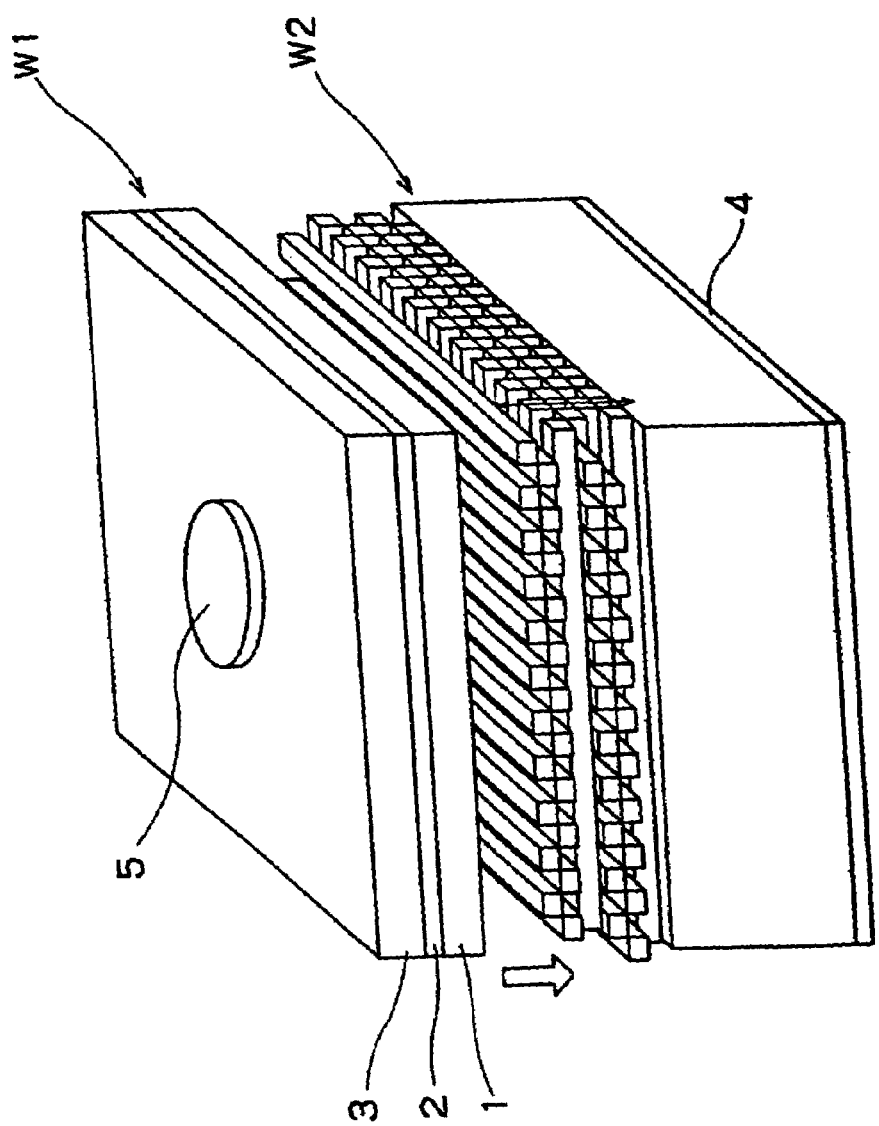
FIG. 15 is a conceptual view of a surface emitting laser using a photonic crystal.

In this embodiment, a gain twice that of the surface emitting semiconductor device shown in FIG. 14 or 15 can be obtained because the active layers are formed at the two ends. This also decreases the current density. In another perspective, the optical device of this embodiment is a novel composite cavity by which two VCSELs (or VCs: Vertical Cavities) are connected by the photonic waveguide 100.

Also, in this embodiment, no reflecting mechanism exists on an end face formed by cleavage or the like, unlike the lasers relevant to the present invention, so all components can be fabricated on the wafer surface. Hence, the planar technology giving satisfactory results in the fabrication of silicon (Si) LSIs (Large Scale Integrated circuits) can be used. Also, as-wafer inspection can be performed without cutting out chips by cleavage. This is a very innovative effect.

Figure 4:
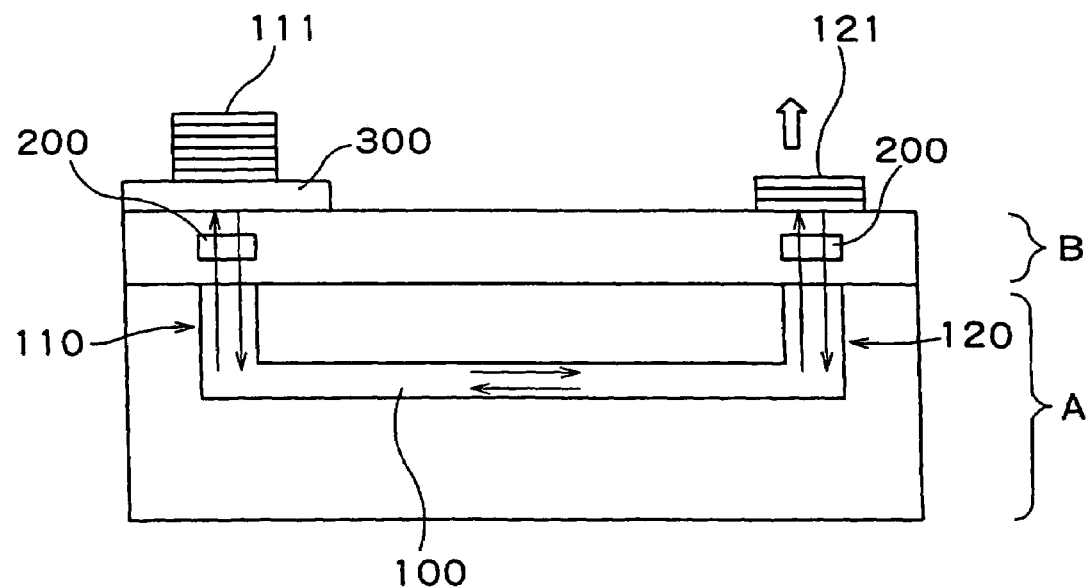
FIG. 4 is a conceptual view showing a modification of the third embodiment.

FIG. 4 is a conceptual view showing a modification of this embodiment. The same reference numerals as in FIG. 3 denote the same elements in FIG. 4, and a detailed description thereof will be omitted. In an optical device of this modification, a surface emitting phase adjuster 300 for adjusting the phase is added to at least one VC (vertical Cavity). The longitudinal oscillation mode of the optical device can be adjusted by this phase adjuster 300. The phase adjuster 300 can be formed by, e.g., a transparent piezoelectric element.

Also, when a photodetector (not shown) is added to at least one VC, the optical device can be used as an optical output monitor. Furthermore, when a surface emitting electro absorption type modulator is integrated on the VC for obtaining output, high-speed output optical modulation of 10 Gbps (Gigabits per second) or higher is possible. Details of the arrangements to which these photodetector and modulator are added will be explained below as the forth embodiment and subsequent embodiments.

(Fourth Embodiment)

An optical device as the fourth embodiment of the present invention will be described below. In this embodiment, the above-mentioned third embodiment is generalized and enhanced.

Figure 5:
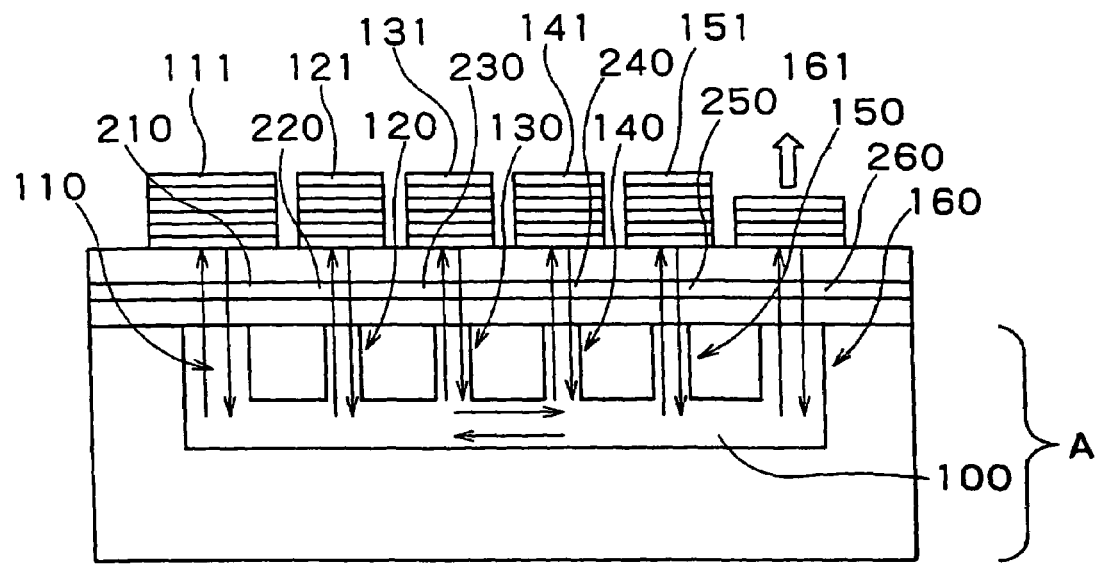
FIG. 5 is a sectional view conceptually showing the arrangement of an optical device as the fourth embodiment of the present invention.

FIG. 5 is a sectional view conceptually showing the arrangement of the optical device of this embodiment. In FIG. 5, the same reference numerals as in FIGS. 1A to 4 denote the same elements previously explained in connection with FIGS. 1A to 4, and a detailed description thereof will be omitted.

The optical device of this embodiment is also based on a waveguide 100 formed in a photonic crystal A. However, a plurality of branched waveguide portions (serving as vertical cavities VC) 110, 120, 130, . . . , are arranged along this photonic waveguide 100. Gain mechanisms 210, 220, 230, . . . , and reflecting mechanisms 111, 121, 131, . . . , are formed at the ends of these branched waveguide portions 110, 120, 130, . . . , respectively.

In this embodiment, by setting the reflectivity of, e.g., the reflecting mechanism 161 on the left-hand end to a slightly low value, lights amplified by the other branched waveguide portions 110 to 150 can be emitted to the outside. Since the gain of each vertical cavity contributes to the emitted light, the output characteristics improve if this composite cavity connected by the photonic waveguide 100 is operated as one optical device.

On the other hand, this optical device in which a plurality of such gain vertical cavities are periodically arranged along the photonic waveguide 100 can also be regarded as a gain/loss-coupled DFB laser (Distributed FeedBack laser). The present inventor proposed an idea relevant to the present invention in Japanese Patent Application No. 10-314842. The arrangement of this prior application is apparently similar to the present invention in respect of a waveguide and vertical resonance along the waveguide. However, the basic concept of the prior art is vertical resonance of "radiation mode light" generated via a high-order diffraction grating along a waveguide. By contrast, the basic principle of the present invention is vertical resonance of "waveguide mode light" itself obtained by a vertically bent waveguide using a photonic crystal. Therefore, it is obvious that the present invention is based on the basic concept similar in appearance to but quite different from the prior art.

That is, in this embodiment a plurality of substantially vertical branches are formed from a waveguide consisting of a photonic crystal, and an optical gain with respect to "waveguide mode light" is obtained in each branch. Consequently, an extremely large optical output can be obtained.

(Fifth Embodiment)

An optical device as the fifth embodiment of the present invention will be described below. In this embodiment, independently drivable phase control mechanisms are added to the individual VCs in the fourth embodiment.

Figure 6:
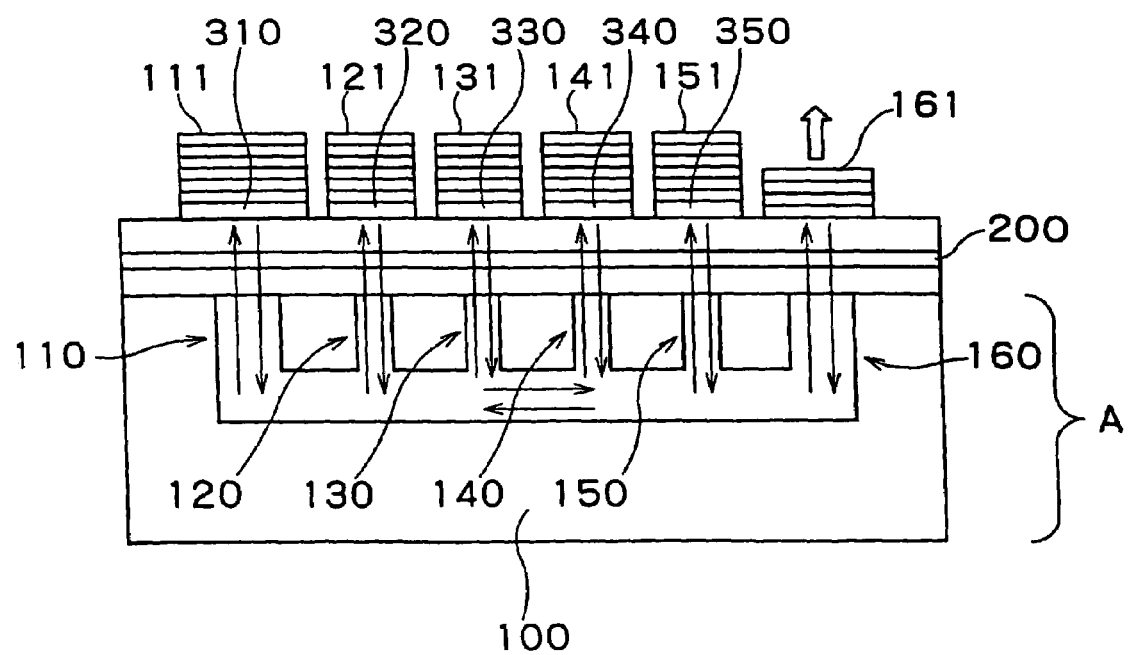
FIG. 6 is a sectional view conceptually showing the arrangement of an optical device as the fifth embodiment of the present invention.

FIG. 6 is a sectional view conceptually showing the arrangement of the optical device of this embodiment. In FIG. 6, the same reference numerals as in FIGS. 1A to 5 denote the same elements previously described in connection with FIGS. 1A to 5, and a detailed description thereof will be omitted.

In this embodiment, phase control mechanism 310 to 350 are formed between gain mechanisms and reflecting mechanisms of individual VCs. These phase control mechanisms adjust the phases of lights in the corresponding VCs, thereby optimizing the oscillation threshold value and longitudinal mode of light emitted from a VC 160.

The oscillation threshold value and longitudinal mode can also be optimized by controlling the reflectivities of high-reflectivity DBRs 111 to 161.

Furthermore, the oscillation threshold value and longitudinal mode can be optimized by slightly changing the wavelength selectivities of the high-reflectivity DBRs 111 to 161 in the individual VCs.

(Sixth Embodiment)

An optical device as the sixth embodiment of the present invention will be described below. In this embodiment, an optical device is given various functions by adding a surface emitting electro absorption type optical modulator and a photodetector by integration.

Figure 7:
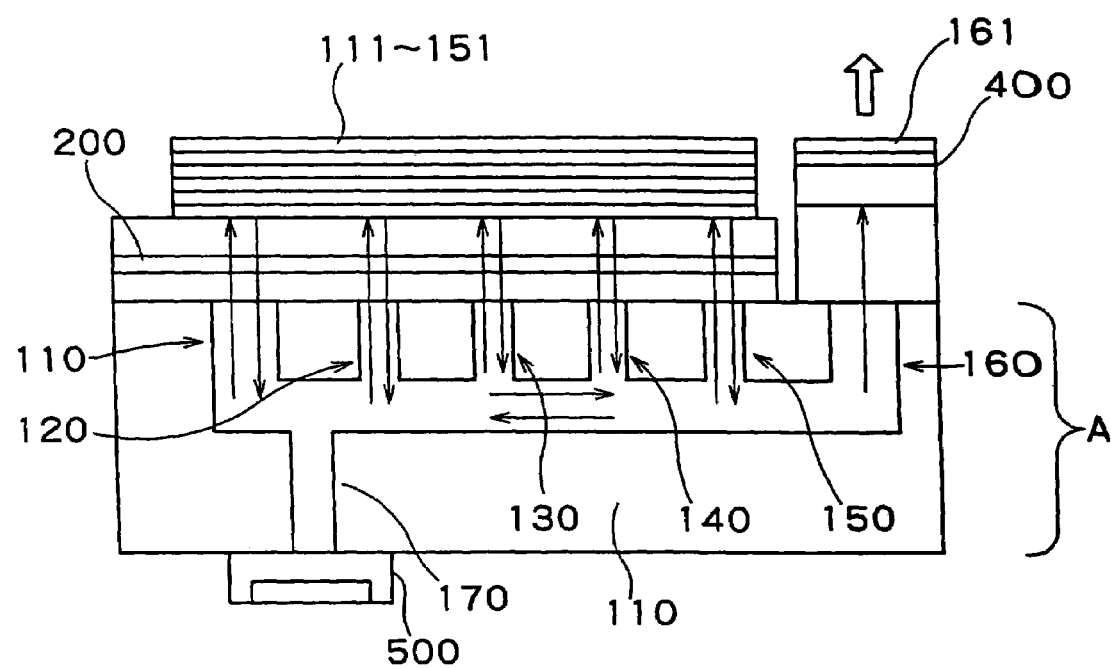
FIG. 7 is a sectional view conceptually showing the arrangement of an optical device as the sixth embodiment of the present invention.

FIG. 7 is a sectional view conceptually showing the arrangement of the optical device of this embodiment. In FIG. 7, the same reference numerals as in FIGS. 1A to 6 denote the same elements described previously in connection with FIGS. 1A to 6, and a detailed description thereof will be omitted.

In this embodiment, a surface emitting electro absorption type optical modulator 400 is formed at the end of a VC 160 at the output end to make modulation of the output light possible. In addition, a branch 170 extending to the rear surface of the, device is formed substantially vertically from a waveguide 100 formed in a photonic crystal A. A photodetector 500 is added by integration to the end portion of the branch 170. As described above, the photodetector 500 is used as an optical output monitor, and the surface emitting electro absorption type modulator 400 makes high-speed output light modulation of 10 Gbps or higher feasible.

The photodetector 500 can also be integrated on the front surface not on the rear surface of the device.

Figure 8:
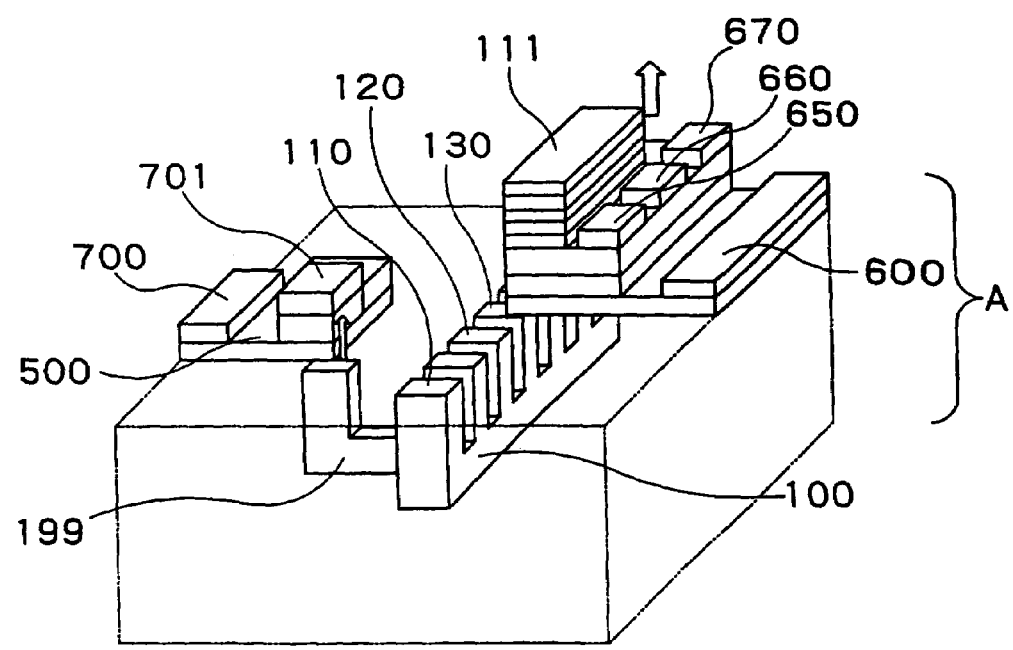
FIG. 8 is a conceptual perspective view showing the arrangement of an optical device on the front surface of which individual elements are integrated.

FIG. 8 is a conceptual perspective view showing the arrangement of an optical device in which elements are thus integrated on the front surface of the device. When a vertically branched photonic waveguide 199 as one characteristic feature of the present invention is extended from a side surface of a main photonic waveguide 100, as shown in FIG. 8, a sufficient space can be ensured on the front surface of the device, so a photodetector 500 can be integrated at the end of this branched waveguide 199. In FIG. 8, reference numerals 700 and 701 denote electrodes of the photodetector; and 600 to 670, electrodes of a gain mechanism or an optical modulator.

In this embodiment, almost all major components of an optical device can be integrated on one surface of the optical device. Therefore, it is possible to use the conventional planar process technology by which fabrication is easy.

(Seventh Embodiment)

An optical device as the seventh embodiment of the present invention will be described below. This embodiment relates to an optical device capable of obtaining a large output from a central vertical cavity (VC) having high optical intensity.

Figure 9:
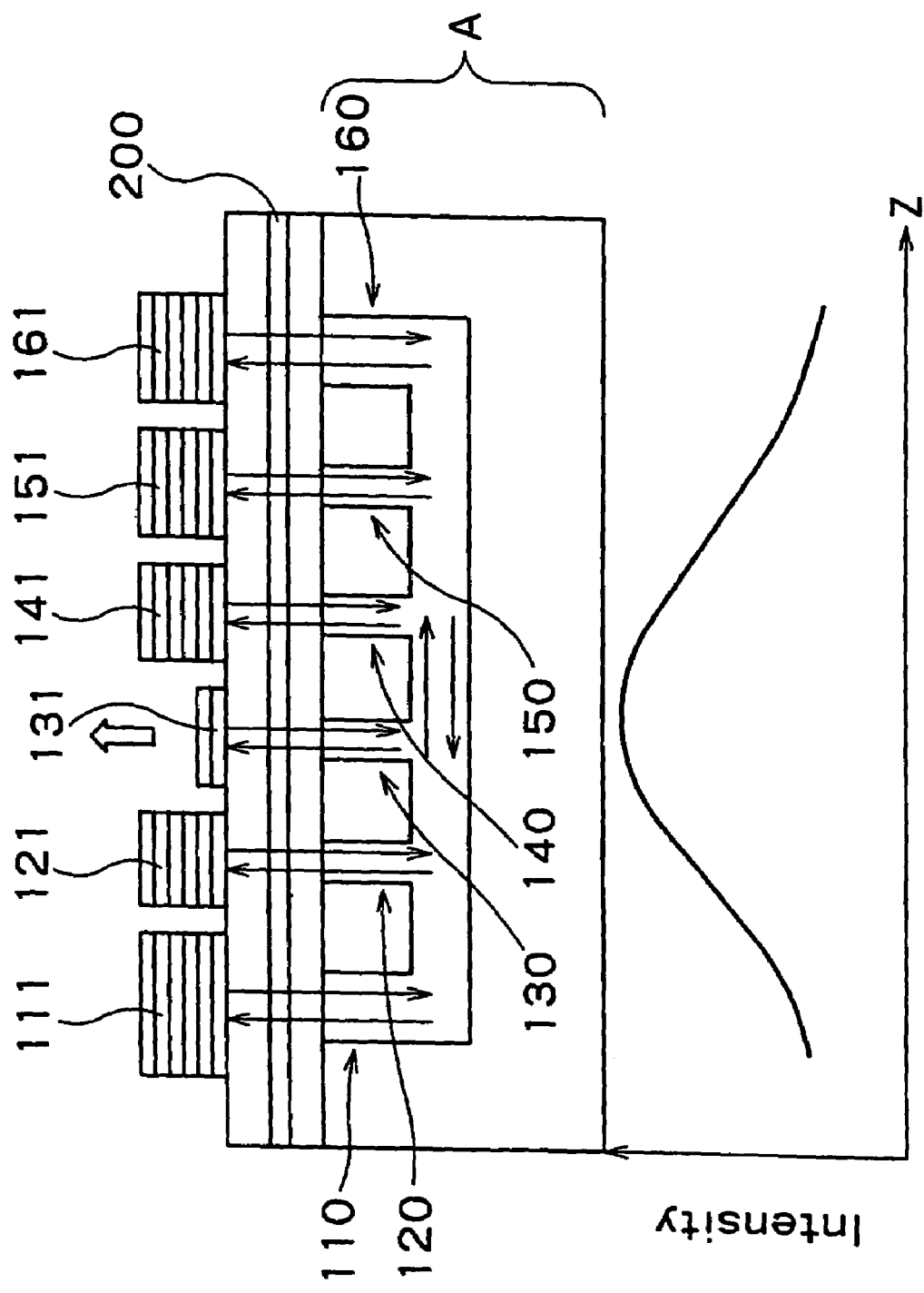
FIG. 9A is a sectional view conceptually showing the arrangement of an optical device as the seventh embodiment of the present invention.
FIG. 9B is a graph showing the light intensity distribution along a waveguide.

FIG. 9A is a sectional view conceptually showing the arrangement of the optical device of this embodiment. FIG. 9B is a graph showing the light intensity distribution along a waveguide 100 of the device. In FIG. 9A, the same reference numerals as in FIGS. 1A to 8 denote the same elements described previously in connection with FIGS. 1A to 8, and a detailed description thereof will be omitted.

In the semiconductor lasers relevant to the present invention, when the Q value of a cavity is increased to increase the light intensity in a central portion of the cavity, the light intensity at the two end faces weakens. Since this lowers the slope efficiency SE, no large output can be easily obtained. By contrast, the optical device of the present invention can obtain a large optical output from a central vertical cavity VC having high light intensity, instead of obtaining small optical outputs from vertical cavities VC at the two end faces of the main photonic waveguide 100 extending in the transverse direction.

As shown in FIG. 9A, for example, the reflectivity of a reflecting means 131 near the center of the photonic waveguide 100 where the light intensity is large is lowered so that an optical output is obtained only from this reflecting means 131. When other reflecting means 111, 121, 141, 151, and 161 are films having high reflectivity close to 100%, a laser device having a low oscillation threshold value and a high slope efficiency can be obtained.

(Eighth Embodiment)

An optical module and optical system using an optical device of the present invention will be described below as the eighth embodiment of the present invention.

Figure 10:
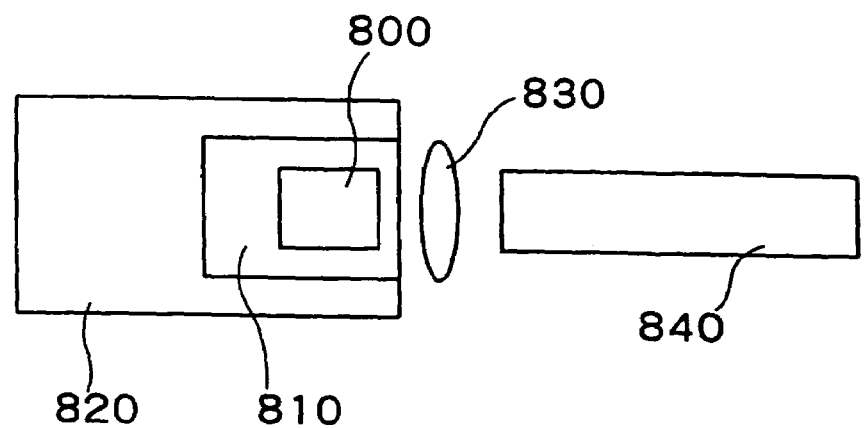
FIG. 10 is a conceptual view showing the arrangement of an optical module according to the present invention.

FIG. 10 is a conceptual view showing the arrangement of the optical module according to the present invention. This optical module of the present invention is fabricated by combining, e.g., an optical device 800 of the present invention, a controller 810 such as a Peltier cooler for controlling the temperature of the optical device 800, a printed circuit board 820 including an APC (Automatic Power Control) circuit and the like, an optical means 830 such as a lens, and an optical fiber 840. However, the optical module does not necessarily include all of these elements, and can also include some other elements.

Also, an optical system such as an optical communication system or optical measurement system using the above optical module can achieve high performance at low cost.

Figure 11:
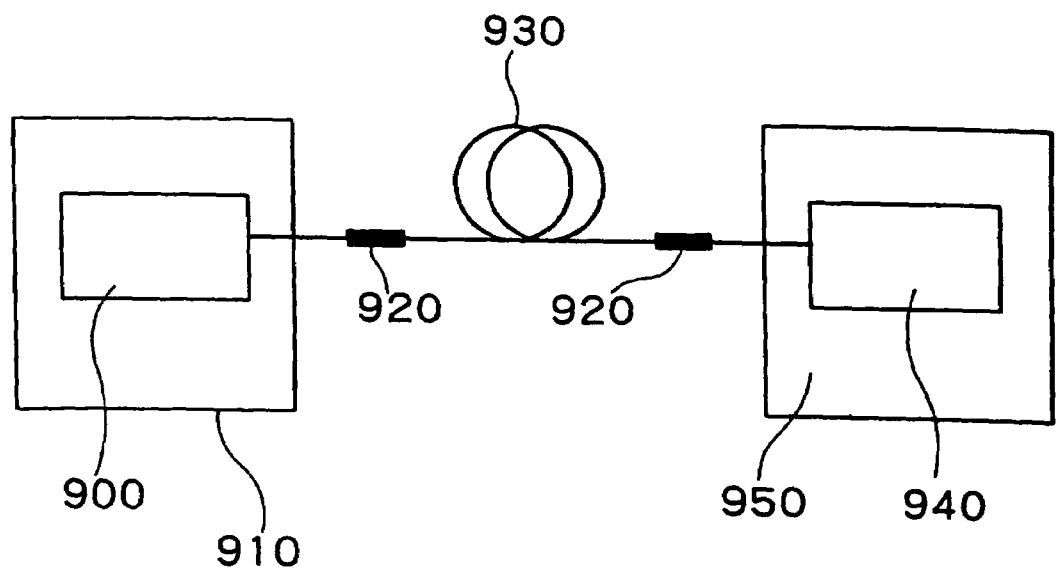
FIG. 11 is a conceptual view showing the arrangement of an optical system according to the present invention.
Figure 12A:
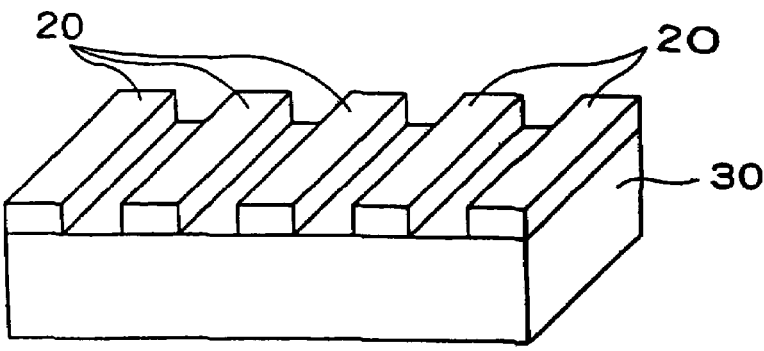
FIGS. 12A to 12D are perspective views conceptually showing the formation steps of a photonic crystal reported by Noda.
Figure 12B:
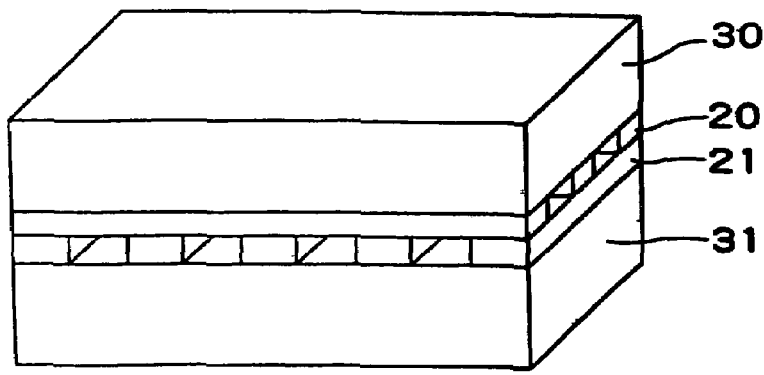
Figure 12C:
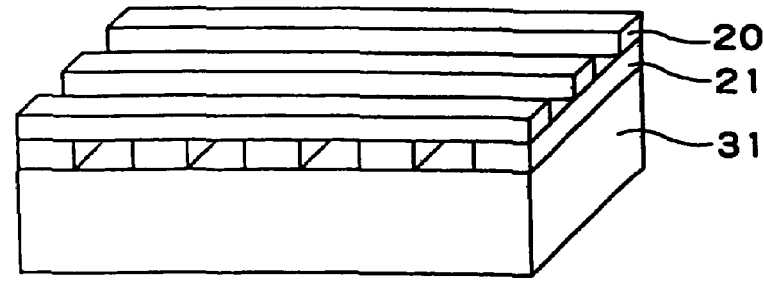
Figure 12D:
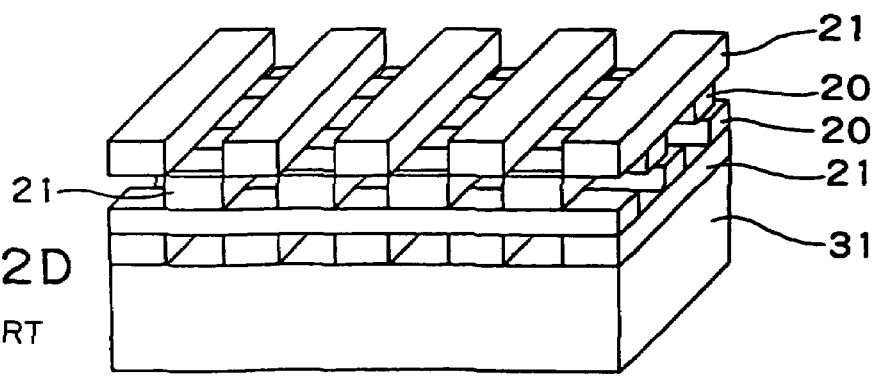
Figure 13:
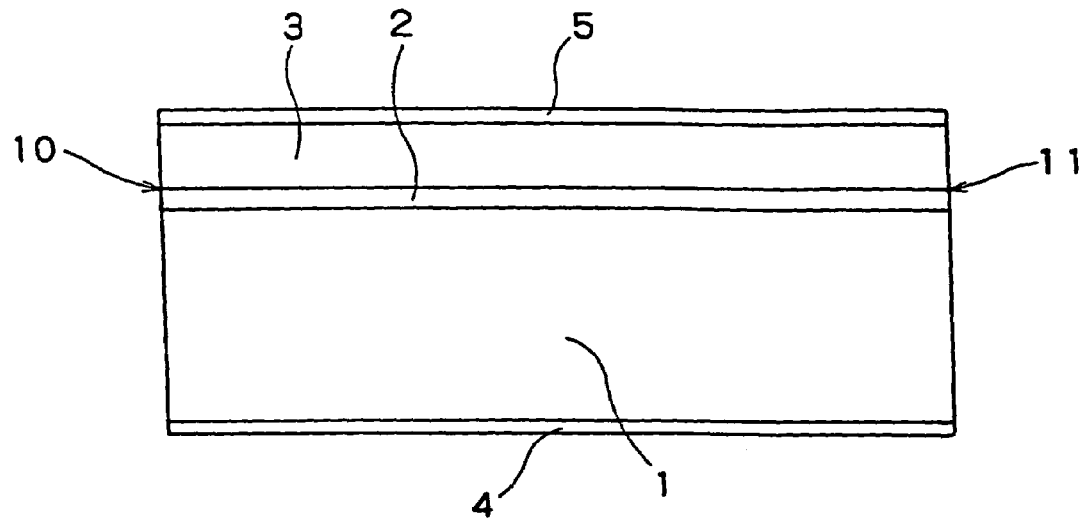
FIG. 13 is a schematic sectional view of a semiconductor laser requiring cleavage surfaces.

FIG. 11 is a conceptual view showing the arrangement of the optical system according to the present invention. In this optical system, a transmission module 900 according to the present invention is controlled by a signal generator laser driver 910 and is connected to a communication optical fiber 930 by an optical connector 920. A transmitted optical signal is received by a receiver module 940 and processed by a signal processor 950.

The optical module and optical system according to the present invention include any of the optical devices previously described in relation to the third to seventh embodiments. Therefore, these optical module and optical system accomplish a small size, high output, low threshold value, stable oscillation mode, broad operating temperature range, and high long-term reliability, and hence are suitably used in various applications such as optical communication.

The embodiments of the present invention have been explained above with reference to thee practical examples. However, the present invention is not limited to these practical examples. For instance, the optical device of the present invention is not restricted to a laser device and can also be implemented as an LED (Light Emitting Device) or an optical modulator. That is, the optical device of the present invention is applicable to diverse optical applied devices based on a waveguide and can achieve similar effects.

Furthermore, similar effects can be obtained by applying the present invention to a light emitting device and an optical modulator, to a light emitting device and a photodetector, or to an optical integrated circuit device combining a light emitting device and a photodetector.

In the present invention as has been described in detail above, a three-dimensional photonic crystal can be easily fabricated. That is, a three-dimensional periodic structure is formed by using a first material which changes in properties relatively easily and a second material which does not change in properties relatively easily, and the first material is preferentially allowed to change in properties to make a refractive index difference between the first and second materials larger than that before the property change. Accordingly, even a hard-to-fuse crystal can be easily formed, no substrate removal step is necessary, and no resources are wasted. Also, crystal growth is possible on an even flat surface of a photonic crystal, and a photonic crystal is readily formable only on a portion of a wafer.

As a consequence, an optical device which has higher performance and occupies a smaller space than the devices relevant to the present invention can be realized at low cost. Since this can be applied to any optical devices, its effect is immeasurable.

Also, an optical device of the present invention comprises a photonic waveguide which is formed in a photonic crystal having a three-dimensional periodic refractive index distribution, and in which the periodic refractive index distribution is locally disturbed, gain means for giving a gain to light propagating in the photonic waveguide, and reflecting means for reflecting light propagating in the photonic waveguide to reverse the propagating direction of the light, wherein resonance can be generated by reversing the propagating direction of light propagating in the photonic waveguide by the reflecting means while a gain is given to the light by the gain means. Therefore, surface light emission is possible, and a high output, high-temperature operation is readily achievable. A small fine spot and a narrow beam are also easily realizable, and the fabrication method is relatively simple.

Consequently, it is possible to realize a high-output surface emitting device and amplification device which can be fabricated by relatively simple steps, which cover a broad temperature range, and which form a small fine spot and a narrow beam.

Furthermore, the present invention can stably and inexpensively fabricate a module or system using such an optical device, so the effects of the present invention are full of impact.

What is claimed is:

1. An optical device comprising:
   a photonic waveguide which is formed in a photonic crystal having a three-dimensional periodic refractive index distribution, and in which the periodic refractive index distribution is locally disturbed;
   gain means for giving a gain to light propagating in said photonic waveguide; and
   reflecting means for reflecting light propagating in said photonic waveguide to reverse the propagating direction of the light,
   wherein resonance is generated by reversing the propagating direction of light propagating in said photonic waveguide by said reflecting means while a gain is given to the light by said gain means,
   wherein said photonic waveguide comprises a main waveguide portion substantially parallel to a principal surface of said photonic crystal and a branched waveguide portion connected at a substantially right angle to said main waveguide and extending toward the principal surface of said photonic crystal, and
   said reflecting means is formed at the end of said branched waveguide portion.

2. A device according to claim 1, wherein
   said photonic waveguide comprises a plurality of branched waveguide portions connected to said main waveguide portion, and
   said reflecting means formed at the end of at least one of said plurality of branched waveguide portions has reflectivity lower than that of reflecting means formed at the ends of other branched waveguide portions, and functions as a light output portion or as a light input portion.

3. A device according to claim 2, wherein said branched waveguide portion corresponding to said light output portion or light input portion is connected to the vicinity of a portion where the intensity of light propagating in said main waveguide portion is a maximum.

4. A device according to claim 3, wherein said plurality of branched waveguide portions are periodically connected at equal intervals to said main waveguide portion.

5. A device according to claim 1, wherein said gain means comprises a semiconductor having a p-n junction and gives the gain by injecting minority carriers into said p-n junction.

6. A device according to claim 1, further comprising phase control means for controlling the phase of light propagating in said photonic waveguide.

7. A device according to claim 1, further comprising light modulating means for modulating output light from said photonic waveguide.

8. A device according to claim 1, further comprising light receiving means for detecting output light from said photonic waveguide.

9. An optical module comprising:
   an optical device according to claim 1;
   a driving circuit for supplying an electric current for driving said optical device; and
   optical means for giving an optical action to output light from said optical device or input light to said optical device.

10. An optical system comprising:
    an optical module according to claim 9;
    a signal supply circuit for supplying an electrical signal to said optical module; and
    guiding means for guiding output light from said optical module.

* * * * *